United States Patent [19]
Molyneaux

[11] Patent Number: 5,394,087
[45] Date of Patent: Feb. 28, 1995

[54] MULTIPLE QUADRATURE SURFACE COIL SYSTEM FOR SIMULTANEOUS IMAGING IN MAGNETIC RESONANCE SYSTEMS

[75] Inventor: David A. Molyneaux, Willowick, Ohio

[73] Assignee: Picker International, Inc., Highland Hts., Ohio

[21] Appl. No.: 104,786

[22] Filed: Aug. 11, 1993

[51] Int. Cl.$^6$ .............................................. G01V 3/00
[52] U.S. Cl. ................... 324/318; 128/653.5
[58] Field of Search ............... 324/322, 318, 314, 309, 324/307; 128/653.5

[56] References Cited

U.S. PATENT DOCUMENTS

| | | | |
|---|---|---|---|
| 4,721,913 | 1/1988 | Hyde et al. | 324/318 |
| 4,825,162 | 4/1989 | Roemer et al. | 324/318 |
| 4,918,388 | 4/1990 | Mehdizadeh et al. | 324/322 |
| 5,196,796 | 3/1993 | Misic et al. | 324/322 |
| 5,198,786 | 3/1993 | Keren | 324/322 |

OTHER PUBLICATIONS

"The NMR Phased Array", Roemer, et al., Academic Press, Inc. 1990 month unknown Magnetic Resonance in Medicine 16, 192–225 (1990).
"Weighting Functions for Combination of NMR Images Obtained with Multiple Surface Coils", Reykowski, et al., p. 519 SMRM Aug. 1990 9th Ann. Meeting.
"Modification of an MR Receiver for Simultaneous Image Acquisition From Two Channels", Wright, p. 533 SMRM Aug. 1989 8th Ann. Meeting.
"Improvement of SNR at Low Field Strength Using Mutually Decoupled Coils For Simultaneous NMR Imaging", Leussler, et al., p. 724 SMRM Aug. 1990 9th Annual Meeting.
"Volume Imaging with MR Phased Arrays", Hayes, et al. p. 175 SMRM Aug. 1989 8th Annual Meeting.

*Primary Examiner*—Louis Arana
*Attorney, Agent, or Firm*—Fay, Sharpe, Beall, Fagan, Minnich & McKee

[57] ABSTRACT

A quadrature multiple coil array (30) includes a plurality of quadrature coil pairs ($50_1, 50_2, \ldots, 50_n$). Each coil pair includes a loop coil (50) or other coil which is sensitive to radio frequency signal components that are perpendicular to the coil and a flat Helmholtz coil (54) or other coil which is sensitive to radio frequency components parallel to the plane of the coil. The coils of each of the quadrature coil pairs are overlapped (56) by an amount which minimizes coupling between the coils. This enables resonance signals to be picked-up concurrently in quadrature by each of the quadrature pairs and be demodulated by a corresponding series of receivers ($32_1, 32_2, \ldots, 32_n$). The data from the overlapping regions to which each quadrature pair is sensitive are reconstructed (36) into image representations (38). The image representations are aligned either automatically (40) or by the operator and displayed on a video monitor (44). The overlapping quadrature pairs can be arranged along a planar substrate or along curved substrates which conform to contours of the anatomy of the subject.

23 Claims, 7 Drawing Sheets

MULTIPLE QUADRATURE SURFACE COIL SYSTEM FOR SIMULTANEOUS IMAGING IN MAGNETIC RESONANCE SYSTEMS

BACKGROUND OF THE INVENTION

The present invention relates to the magnetic resonance arts. It finds particular application in conjunction with phased array quadrature surface coils for medical diagnostic applications of magnetic resonance imaging and will be described with particular reference thereto. However, it is to be appreciated, that the present invention will also find application with other phased array coil techniques, spectroscopy, imaging for other than medical diagnostic purposes, and the like.

Conventionally, magnetic resonance imaging procedures include the excitation of magnetic resonance of selected dipoles within a subject and receiving the magnetic resonance signals emanating from the dipoles. In many applications, the magnetic resonance signals are received with whole body RF coils, i.e. circularly cylindrical RF coils which surround the patient receiving bore of the magnetic resonance imaging apparatus. In other applications, a surface coil is applied to a surface of the patient adjacent the area of interest while the patient is located within the bore to receive the magnetic resonance signals emanating from the resonating nuclei.

Various surface coil configurations have been utilized. A simple loop, e.g. a simple square or circle, coils have been utilized to receive the magnetic resonance signals. Loop coils are sensitive to signal components that are perpendicular to the loop and insensitive to components in the plane of the loop. In order to improve the signal-to-noise ratio, quadrature surface coils have been utilized to examine a region of interest in quadrature, i.e. receive signal components that are perpendicular to the coil and components that are parallel to the coil. See, for example, U.S. Pat. No. 4,918,388 which includes a loop coil and a flat Helmholtz coil, both of which receive resonance signals from the same region. The loop and flat Helmholtz coils are sensitive to orthogonal components of the magnetic resonance signal. When the output of one of the loop and flat Helmholtz coils is phase shifted by 90° and the two signals are combined, the signal-to-noise ratio is improved by about the square root of 2.

In order to examine larger regions, surface coils consisting of a plurality of loop coils have been used. See, for example, U.S. Pat. No. 4,825,162 of Roemer and Edelstein. More specifically, a series of loop coils are partially overlapped in order to examine contiguous regions. As explained mathematically by Grover in "Inductance Calculations" (1946) and summarized in the Roemer and Edelstein patent, the mutual inductance between adjacent coils is minimized when the coils are positioned with a slight overlap. Although the use of overlapped loop coils with the induction minimized enabled a larger area to be examined, each coil was linear, i.e. only sensitive to the perpendicular component. No quadrature detection was provided.

Another surface coil technique for examining a larger area includes positioning a series of coils in a partially overlapping relationship. However, instead of selecting an overlap which minimized the mutual inductance between like loop coils, alternate linear coils are 90° out of phase from each other, i.e. orthogonal, to eliminate the mutual inductance. See U.S. Pat. No. 4,721,913 of Hyde, et al. In the Hyde, et al. patent, the series of linear coils were arranged contiguous to each other to examine partially overlapping regions. The polarity of the coils alternates between orthogonal component sensitive coils and parallel component sensitive coils.

The present invention provides a new and improved quadrature multiple coil array which overcomes the above-referenced problems and others.

SUMMARY OF THE INVENTION

In accordance with the present invention, a quadrature phased array coil assembly is provided with quadrature sensitivity to common regions.

In accordance with another aspect of the present invention, a plurality of quadrature coil pairs are overlapped such that (1) mutual inductance is minimized and (2) each pair views adjoining regions of the subject.

In accordance with a more limited aspect of the present invention, a first plurality of coils which have sensitivity parallel to a surface of the coil assembly are arranged (1) to have minimum mutual inductance and (2) to view adjoining subregions of the subject. A second plurality of coils with sensitivity perpendicular to the surface of the coil assembly are disposed to have (1) minimum mutual inductance, (2) minimum coupling with coils of the first plurality of coils, and (3) sensitivity to substantially the same region of an examined object as the first plurality of coils.

In accordance with a more specific embodiment of the present invention, the first and second pluralities of coils are arranged in a plane.

In accordance with another aspect of the present invention, the first and second plurality of coils are curved along a contour which generally conforms with a surface of a subject adjacent the region of interest.

One advantage of the present invention is that it improves signal-to-noise and reduces signal acquisition times.

Another advantage of the present invention is that the coils are able to fit the anatomical area of interest.

Yet another advantage is that the coils simultaneously receive signals from a common region in quadrature.

Still further advantages of the present invention will become apparent to those of ordinary skill in the art upon reading and understanding the following detailed description of the preferred embodiments.

BRIEF DESCRIPTION OF THE DRAWINGS

The invention may take form in various components and arrangements of components, and in various steps and arrangements of steps. The drawings are only for purposes of illustrating the preferred embodiments and are not to be construed as limiting the invention.

DETAILED DESCRIPTION OF THE PREFERRED EMBODIMENTS

Figure 1:
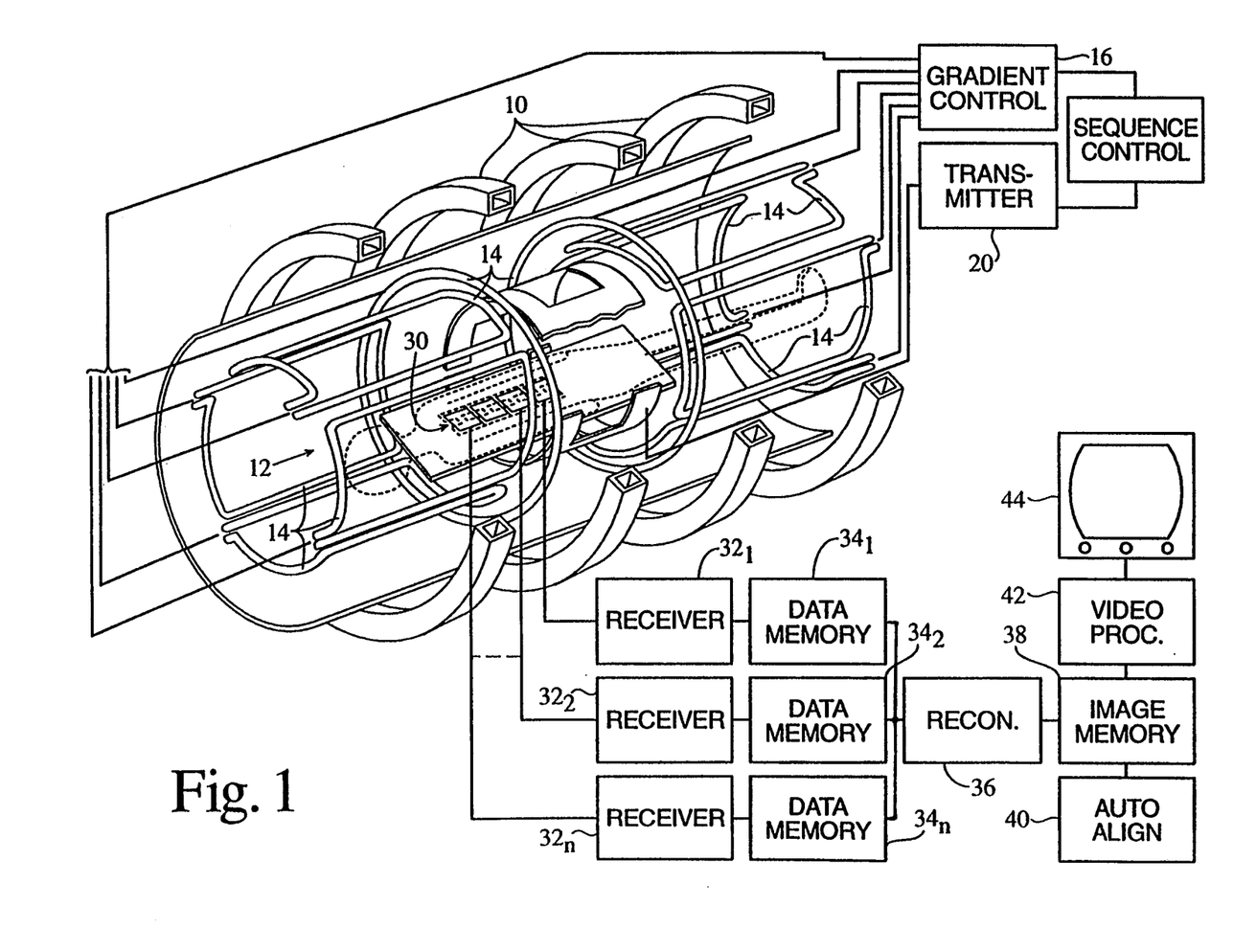
FIG. 1 is a diagrammatic illustration of a magnetic resonance system including a planar surface coil in accordance with the present invention.

With reference to FIG. 1, primary superconducting or inductive magnets 10 create a temporally constant magnetic field through an examination region or central bore 12. Gradient field coils 14 under control of a gradient field coil means 16 selectively cause magnetic field gradients or gradient pulses across the main magnetic field. A radio frequency transmitter 20 supplies radio frequency signals or pulses to a radio frequency coil 22 which surrounds the bore 12. The radio frequency transmitter and the whole body radio frequency coil are tuned to match a resonance frequency of preselected dipoles in the subject at the magnetic field strength of the primary magnets 10. A sequence control means 24 controls the radio frequency transmitter 20 and the gradient coil control 16 in order to cause conventional magnetic resonance imaging sequences to be implemented.

A quadrature, multiple coil array 30 receives resonance signals from the resonating dipoles within the subject. The quadrature coils of the array 30 convey the quadrature signals to a corresponding multiplicity of receivers $32_1, 32_2, \ldots, 32_n$. A corresponding plurality of data memory means $34_1, 34_2, \ldots, 34_n$ store the magnetic resonance data lines demodulated by the receivers. A reconstruction means 36 includes a series of inverse two-dimensional Fourier transform means which transform the data lines from the data memories 34 into a corresponding series of overlapping images which are stored in an image memory 38. Optionally, an image alignment means 40 may align and piece together the multiple images. Anatomical markers may be disposed at various points along the common image regions of the quadrature coil pairs of the multiple coil array 30 to simplify the image alignment procedure. Alternately, a single marker on the coil and a lookup table which identifies the spatial position of each coil relative to the marker can be utilized. A video processor 42 converts selected image data from the image memory 38 into appropriate format for display on the video monitor 44.

Figure 2:
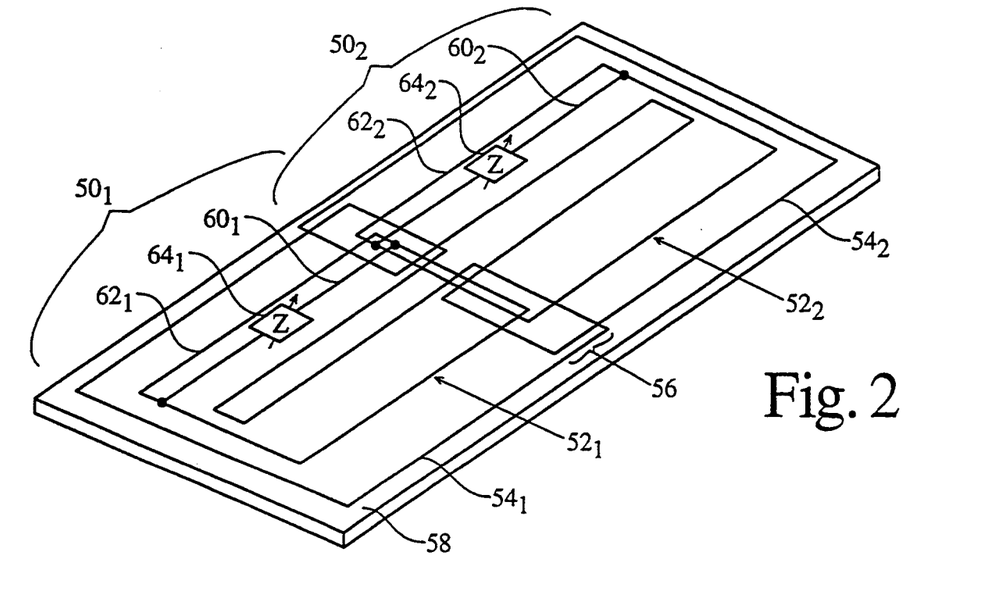
FIG. 2 is a detailed view of a quadrature phased array coil including two quadrature pairs.

With reference to FIG. 2, the quadrature multi-coil array 30 includes two quadrature coil pairs which are sensitive to signal components orthogonal to the plane of the coils, e.g. square loop coils. The quadrature pairs further include $54_1, 54_2$ which are sensitive to electromagnetic signal components parallel to the plane of the coil, e.g. flattened Helmholtz coils or double loop coils. The perpendicular component sensitive coils and the parallel component sensitive coils are mounted to have substantially the same fields of view. The coils have an overlap region 56 orthogonal to the z-axis in which the four coils are partially overlapping. Preferably, the perpendicular component sensitive coils 52 and the parallel component sensitive coils 54 are mounted on opposite faces of a thin dielectric substrate 58.

The perpendicular and parallel component sensitive coils 52 and 54 should be sensitive to fields which are orthogonal to each other for true quadrature detection. The individual coils of each quadrature pair are physically dimensioned and positioned such that sensitivity is orthogonal and there is minimum mutual inductance. Due to imperfections in the coils, their mounting, or even the normal environment in which the coils are used, the two coils 52, 54 may not be truly orthogonal to each other. To simplify manufacturing, the coils $52_1$ and $52_2$ include additional conductors $60_1$ and $60_2$ in parallel with one of the loop conductors $64_1$ and $64_2$ parallel to the z-axis. Adjustable reactances $64_1$ and $64_2$ selectively adjust the amount of current flowing through conductors $60_1$ and $60_2$ relative to conductors $62_1$ and $62_2$ in order to minimize the mutual inductance between coils 52 and coil 54. Alternately, analogous adjustable reactances can be added to coils 54 to adjust the mutual inductance relative to coils 52.

Figure 3:
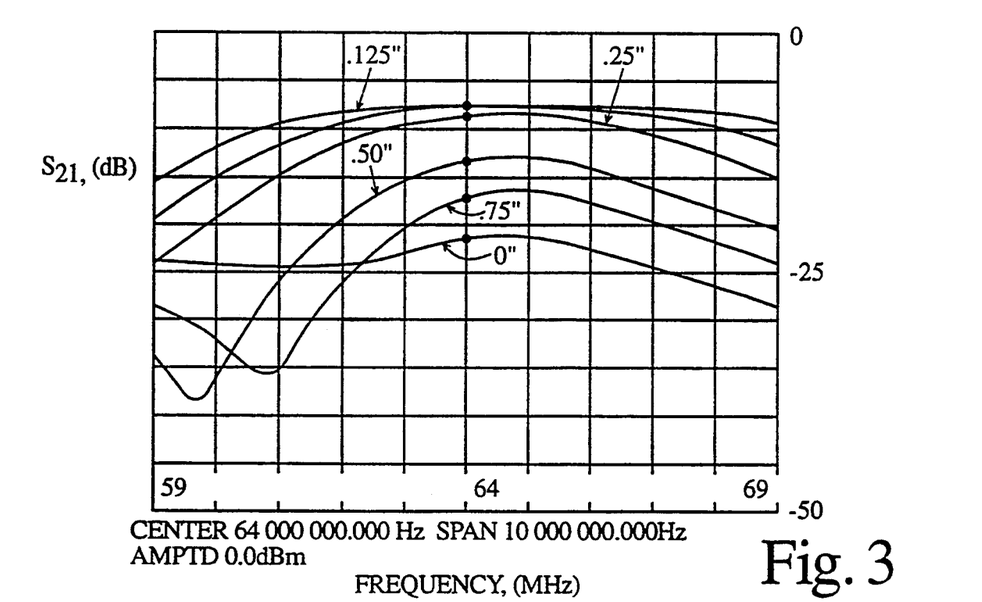
FIG. 3 is a graphic representation of coupling between the loop coils of FIG. 2, with the different curves representing different amounts of overlap along an edge orthogonal to the z-axis.
Figure 4:
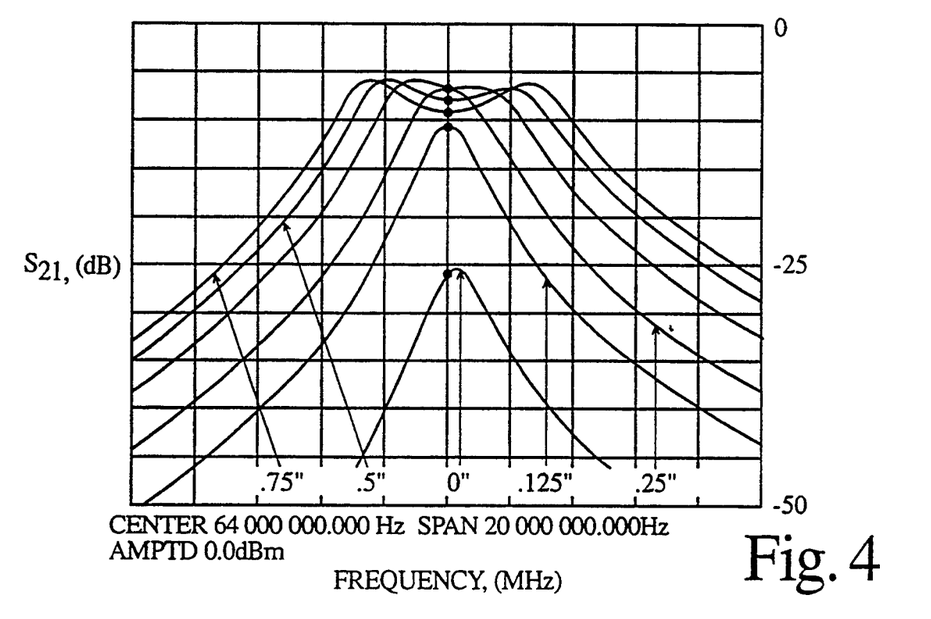
FIG. 4 illustrates coupling between the flat Helmholtz coils of FIG. 2 for different amounts of overlap along an edge orthogonal to the central or z-axis.
Figure 5:
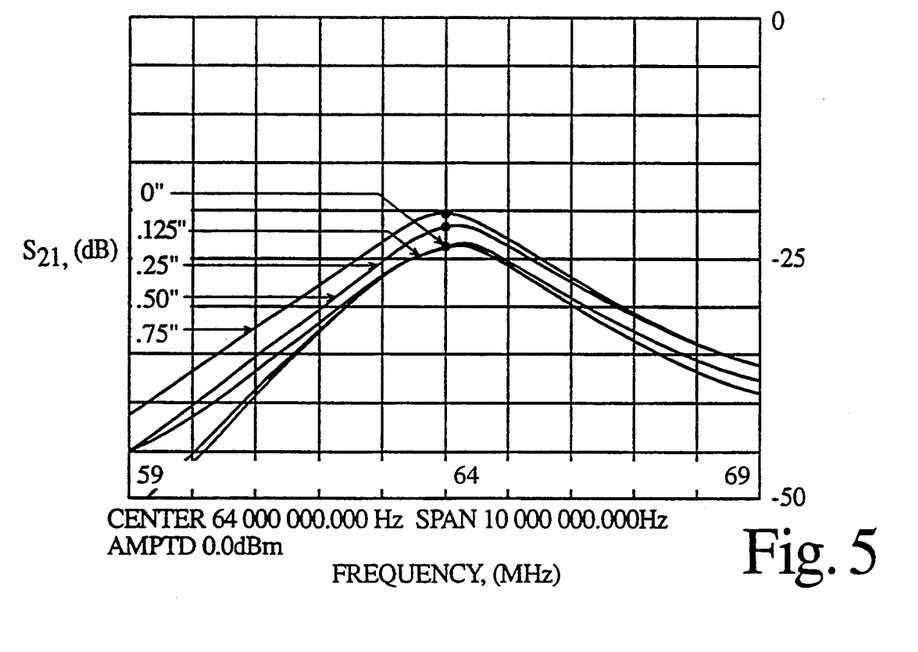
FIG. 5 illustrates coupling between an adjacent loop and flat Helmholtz coil of FIG. 2 as a function of overlap.

With reference to FIG. 3, the mutual inductance between the perpendicular component sensitive coils 52, particularly the illustrated square loop coils, is dependent on the spacing or amount of overlap of the coils. As shown in FIG. 3, the amount of mutual inductance can be minimized for a given frequency by adjusting the amount of overlap. Similarly, as illustrated in FIG. 4, the mutual inductance between the parallel component sensitive coils 54 can be minimized by adjusting their overlap. Analogously, as shown in FIG. 5, the amount of coupling between adjacent coils which are sensitive to fields orthogonal to each other is independent of overlap due to their orthogonal nature. The amount of overlap and, where necessary, the physical size of the coils, are adjusted in accordance with FIGS. 3, 4, and 5 to minimize the coupling or mutual inductance between the coils.

Figure 6:
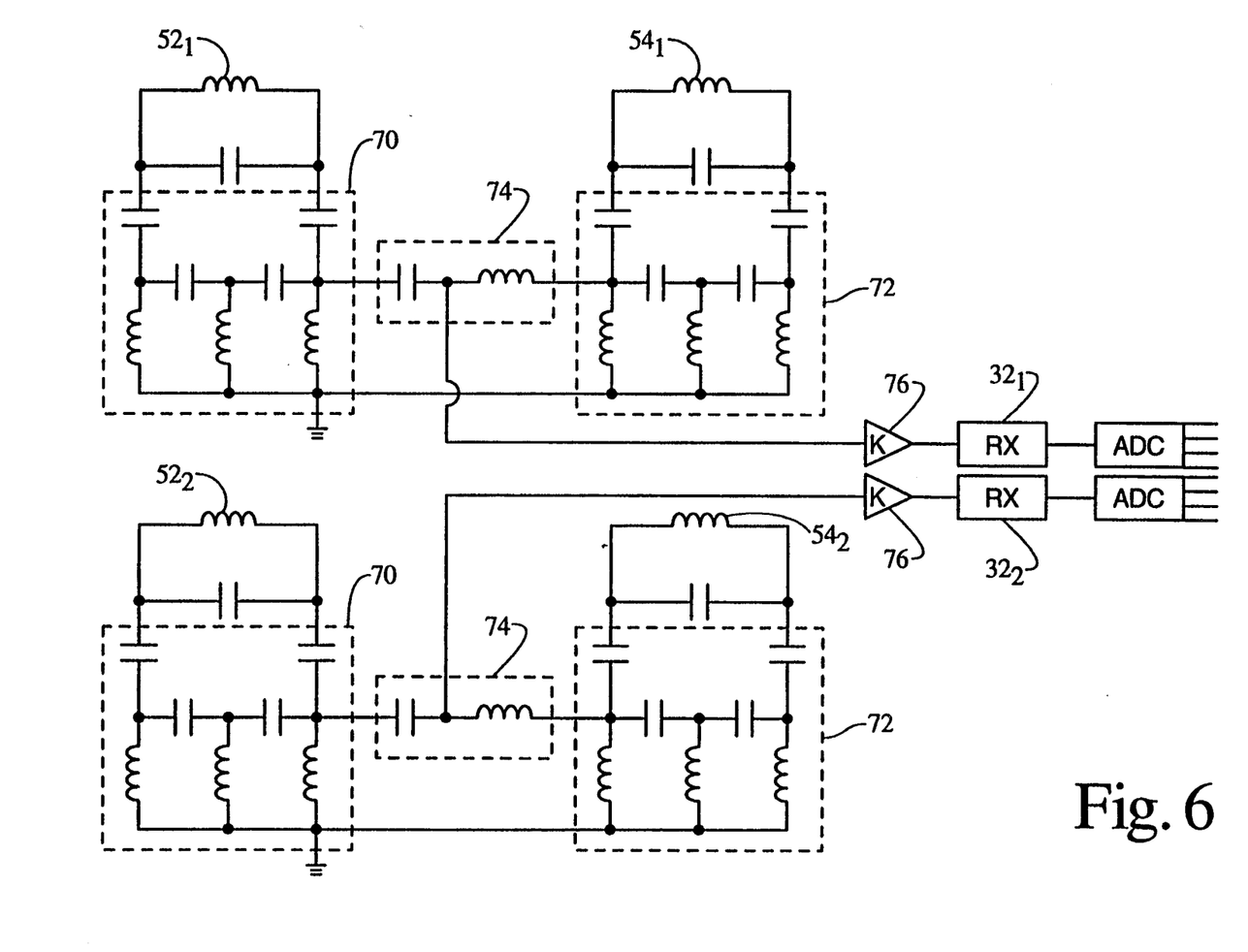
FIG. 6 is a schematic of the interface circuitry for each quadrature coil pair of a two coil array.

With reference to FIG. 6, the perpendicular component sensitive coil 52 and the parallel component sensitive coil 54 of each of the quadrature coil pairs 50 are interconnected to produce a single output signal. More specifically, each of the coils 52 which are sensitive to fields perpendicular to the coil are connected with a matching circuit 70. Each of the coils 54 which are sensitive to fields parallel to the coil are connected with a matching circuit 72. A quadrature combiner and phase shifter 74 shift the phase of the output of each coil of the quadrature pair 50 by +45° and −45° respectively, and sums or combines the signals into a single output. Preferably, each of the output signals is amplified by a preamplifier 76 also mounted with the quadrature multiple coil array 30 for insertion into the bore amplifies the output signals before they are conveyed to their respective receivers $32_1, 32_2, \ldots, 32_n$.

Figure 7:
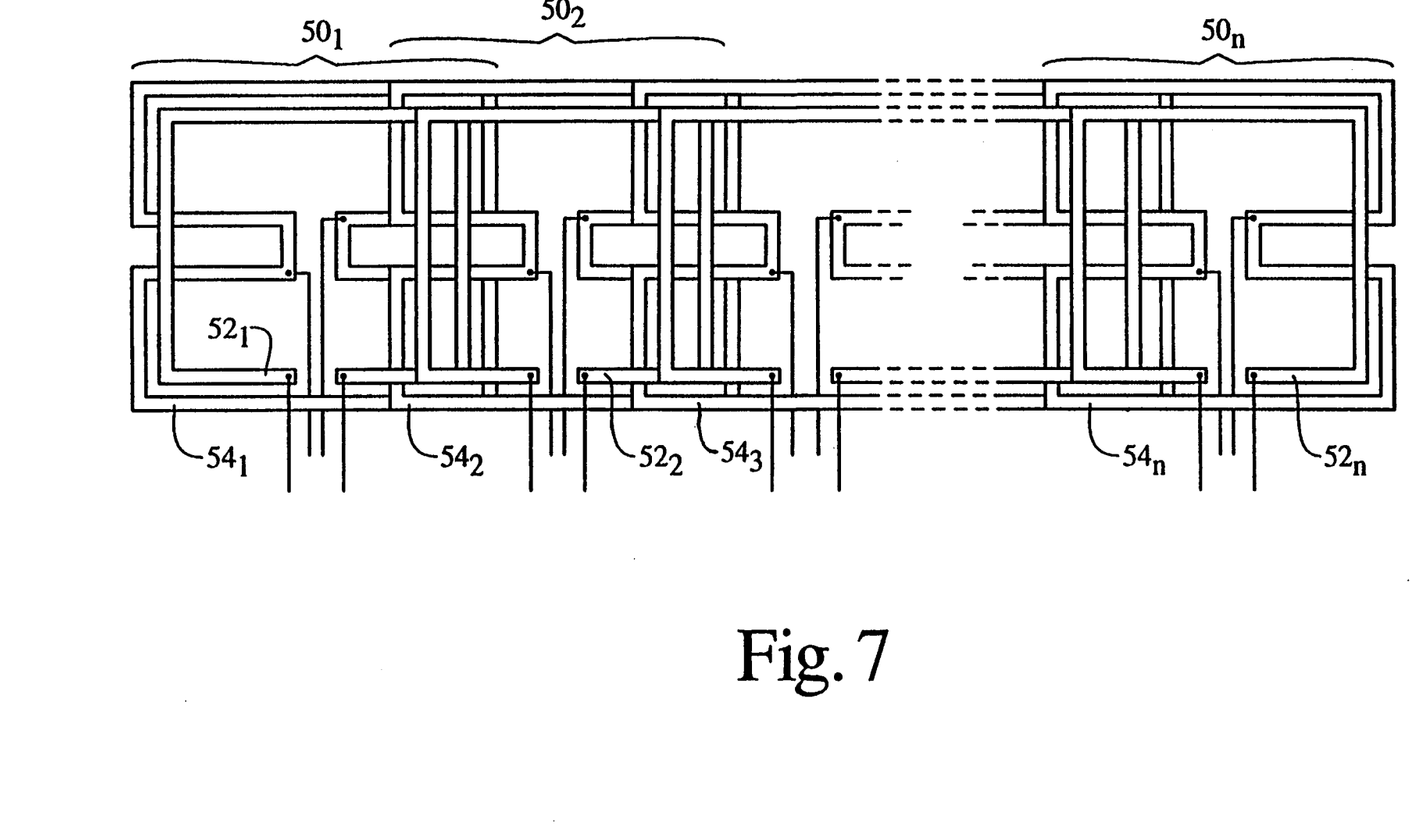
FIG. 7 is a diagrammatic illustration of a larger multiplicity of the quadrature coil pairs.

With reference to FIG. 7, the quadrature multiple coil array 30 may include any number of quadrature coil pairs $50_1, 50_2, \ldots, 50_n$, each including a coil $52_1, 52_2, \ldots, 52_n$ for receiving signal components perpendicular to the plane or surface of the coil and a coil $54_1, 54_2, \ldots$ ..., $54_n$ for receiving signal components generally parallel to the surface of the coil. The overlap region 56 configured as discussed above is defined between each of the adjacent quadrature coil pairs $50_1$, $50_2$, ..., $50_n$.

Although the quadrature pair is illustrated as including a rectangular loop coil and a flat Helmholtz coil of substantially square design, other coils are also contemplated. For example, the loop coil can be square, rectangular, circular, elliptical, or combinations thereof. Counter-rotating loop coils and double loop coils, such as loop coils disposed above and below the subject, can also be utilized. The coil which is sensitive to magnetization parallel to the plane instead of being a flat Helmholtz coil can also be a butterfly coil, a planar pair, or the like.

Figure 8:
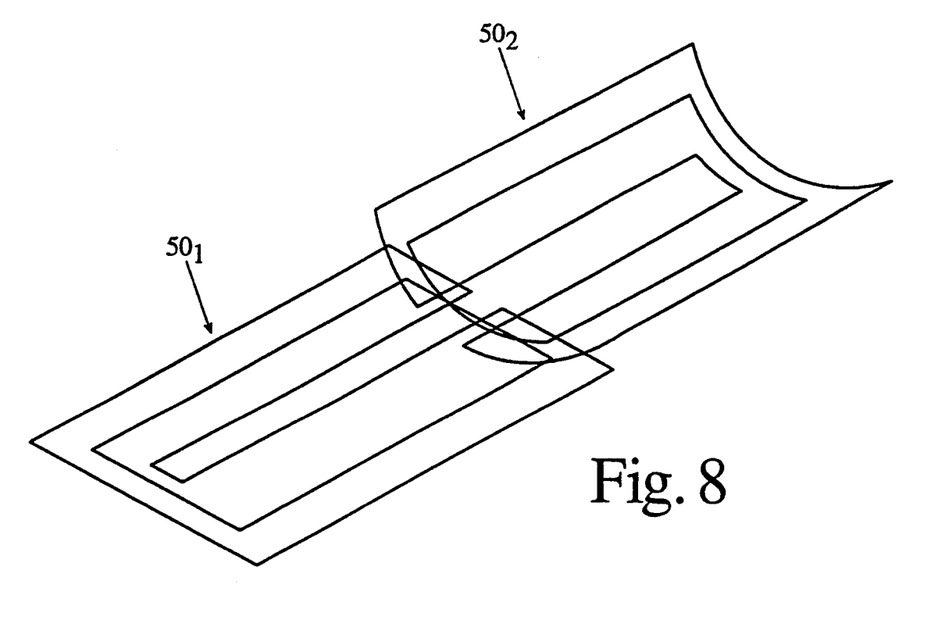
FIG. 8 illustrates a quadrature multiple coil array with one of the quadrature pairs flat such as for placement below the spine and another quadrature pair curved such as for conformity to a patient's neck.

With reference to FIG. 8, the quadrature pairs 50 need not be positioned on a planar substrate. Rather, the pairs may be placed on a substrate which is curved or contoured to conform to cylindrical, elliptical, or other body shapes such as the torso, the knee, the head, and the like. For portions of the body which change curvature, such as between the neck and back, at least one quadrature pair $50_1$ is flat for disposition along the spine under the patient's back and another quadrature pair $50_2$ is curved for conformity to the patient's neck. Additional flat quadrature pairs may be provided to extend the imaging region further down the patient's back. Analogously, additional curved quadrature pairs may be provided for extending the imaging region further along the patient's head.

Figure 9:
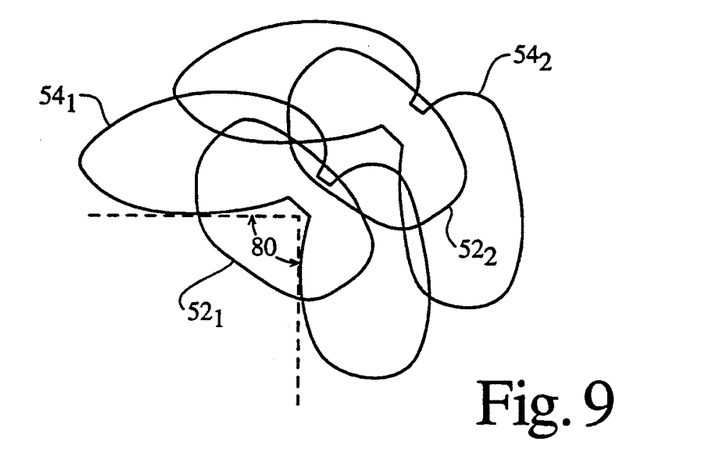
FIG. 9 is a quadrature multiple coil array in which a pair of loop coils for sensitivity perpendicular to their plane are arranged in a plane and a pair of double loop coils are arranged along intersecting angled planes, e.g. at about 135°.

With reference to FIG. 9, a plurality of half curved Helmholtz coils $54_1$, $54_2$ are curved to fit other anatomical structures such as orbits of the eye or a single knee. The Helmholtz coil halves lie along surfaces which intersect at an angle 80° and the loop coils $52_1$, $52_2$ are flat.

Figure 10:
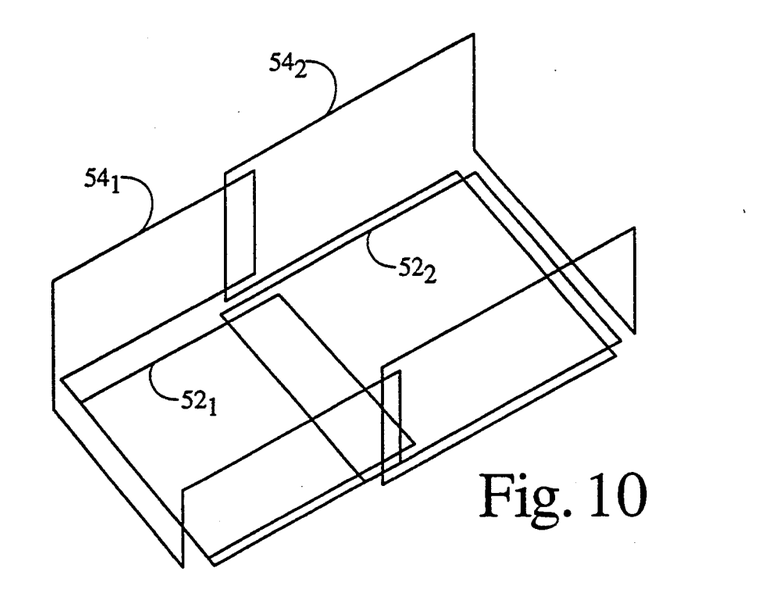
FIG. 10 is a quadrature multiple coil array including a pair of flat loop coils and non-flattened Helmholtz coils; and, FIG. 11 is a schematic diagram of interface circuitry on the multiple coil array.

With reference to FIG. 10, each coil pair includes a flat loop $52_1$, $52_2$ and an unflattened Helmholtz coil $54_1$, $54_2$ distributed along the z-axis for extremity imaging.

Figure 11:
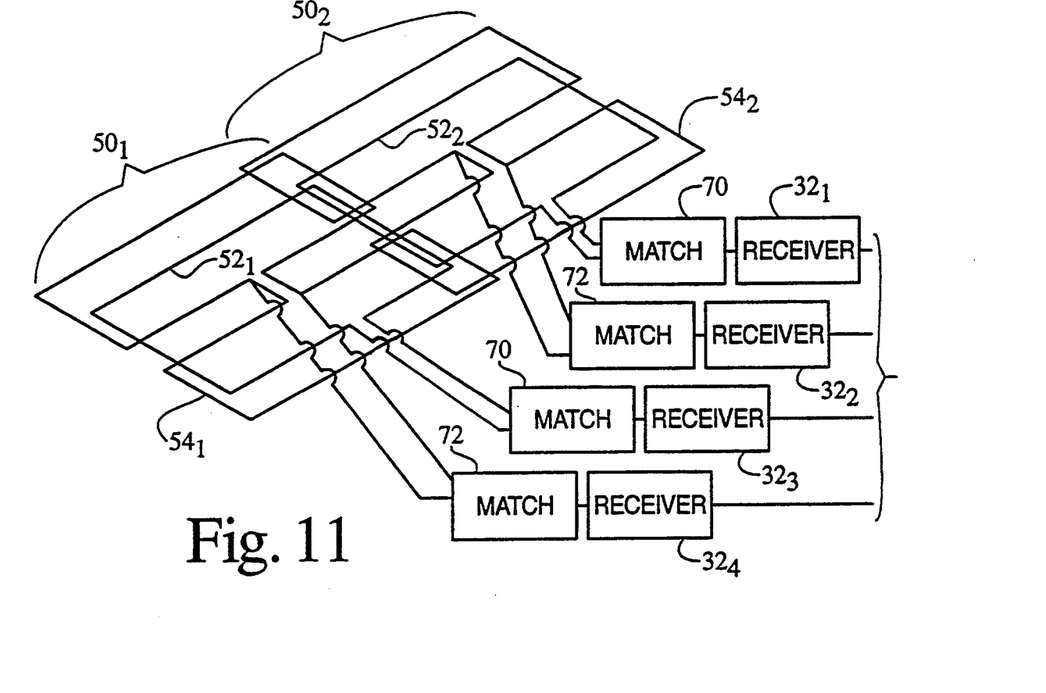

With reference to FIG. 11, alternately, instead of conveying combined analog signals from the coils to the receivers 32, a receiver can be provided for each of the coils 52 and 54 of the multiple coil array. The receivers are preferably digital receivers which demodulate and digitize the received resonance signals. Of course, twice as many amplifiers are required when the signals from the loop and Helmholtz coils are not combined prior to being forwarded to the receiver.

Other alternatives include placing a plurality of coils such as illustrated in the preceding examples around a portion of the patient to be imaged. For example, planar coil arrays as illustrated in FIG. 2 can be positioned above and below the patient distributed along the z-axis for imaging the patient's heart. Other combinations of the above examples of curved and flat multiple coil arrays can be used for examining other areas of the patient's torso, the pelvis, or the like. The spaced coil pairs can be rotated in the x-y plane, provided there is sufficient spacing between the multiple coil assemblies to minimize their mutual inductance. The above-described embodiments can also be used as double tuned coils for multi-channel spectroscopy imaging such that each nuclei is detected in quadrature.

Although the preferred embodiment describes exciting the magnetic resonance with the whole body radio frequency coil 22, it is to be appreciated that the above-described surface coils can also be used in a transmit mode.

The invention has been described with reference to the preferred embodiment. Obviously, modifications and alterations will occur to others upon reading and understanding the preceding detailed description. It is intended that the invention be construed as including all such modifications and alterations insofar as they come within the scope of the appended claims or the equivalents thereof.

Having thus described the preferred embodiments, the invention is now claimed to be:

1. A magnetic resonance imaging system comprising:
    a main magnetic field means for generating a temporally constant magnetic field through an examination region;
    a gradient field means for selectively causing gradient magnetic fields across the examination region;
    a resonance excitation means for transmitting radio frequency signals into the examination region to excite selected dipoles within the examination region to resonate;
    a quadrature multiple coil array disposed within the examination region for simultaneously receiving radio frequency resonance signals in quadrature, from the resonating dipoles, the quadrature multiple coil array including:
        a first quadrature coil pair including a first perpendicular component sensitive coil sensitive to resonance signal components perpendicular to the first quadrature coil pair from a first subregion of the examination region and a first parallel component sensitive coil sensitive to resonance signal components parallel to the first quadrature coil pair from said first subregion of the examination region;
        a second quadrature coil pair including a second perpendicular component sensitive coil sensitive to resonance signal components perpendicular to the second coil pair from a second subregion of the examination region and a second parallel component sensitive coil sensitive to resonance signal components from said second subregion which are parallel to the second coil pair, the first and second subregions being partially overlapping;
        at least two receiver means connected with the first and second quadrature coil pairs for demodulating magnetic resonance signals therefrom;
        an image reconstruction means for constructing signals from the first receiver means into an image representation;
        a display means for converting the image representations into human readable displays.

2. The system as set forth in claim 1 wherein the first and second quadrature coil pairs are partially overlapping with an amount of overlap which minimizes mutual inductance and coupling between the coils.

3. The system as set forth in claim 1 wherein the first perpendicular component sensitive coil includes one of a loop coil, a double loop coil, and a counter-rotating loop coil;
    the second perpendicular component sensitive coil includes one of a loop coil, a double loop coil, and a counter-rotating loop coil;
    the first parallel component sensitive coil includes one of a flat Helmholtz coil, a butterfly coil, and a planar pair;

the second parallel component sensitive coil includes one of a flat Helmholtz coil, a butterfly coil, and a planar pair.

4. The system as set forth in claim 1 wherein at least one of the coils in each of the quadrature coil pairs includes an adjustable asymmetric portion for electronically adjusting the orthogonality of the quadrature coil pair.

5. The system as set forth in claim 1 wherein the quadrature multiple coil array extends along a parallel plane.

6. The system as set forth in claim 1 wherein the quadrature multiple coil array extends along a contoured surface.

7. The system as set forth in claim 1 wherein a first portion of the quadrature multiple coil array extends along a plane and a second portion of the quadrature multiple coil array extends along a curved surface.

8. The system as set forth in claim 1 wherein the first and second quadrature coil pairs include first and second loop coils disposed in a common plane and first and second Helmholtz coils.

9. The system as set forth in claim 1 further including:
a first combiner means for phase shifting and combining the resonance signal components received by the first perpendicular component sensitive coil and the first parallel component sensitive coil;
a second combiner means for phase shifting and combining the resonance signal components received by the second perpendicular component sensitive coil and the second parallel component sensitive coil;
and wherein the receiver means includes:
a first receiver connected with the first combiner means; and
a second receiver connected with the second combiner means.

10. The system as set forth in claim 1 further including:
a first receiver connected with the first perpendicular component sensitive coil for demodulating and digitizing resonance signal components received thereby;
a second receiver connected with the first parallel component sensitive coil for demodulating and digitizing resonance signal components received thereby;
a third receiver connected with the second perpendicular component sensitive coil for demodulating and digitizing resonance signal components received thereby;
a fourth receiver connected with the second parallel component sensitive coil for demodulating and digitizing resonance signal components received thereby.

11. The system as set forth in claim 1 wherein the quadrature multiple coil array further includes:
a third quadrature coil pair including a third perpendicular component sensitive coil sensitive to resonance signal components perpendicular to the third coil pair from a third subregion of the examination region and a third parallel component sensitive coil sensitive to resonance signal components from the third subregion which are parallel to the third coil pair, the second and third subregions being partially overlapping.

12. A magnetic resonance imaging system comprising:
a main magnetic field means for generating a temporally constant magnetic field through an examination region;
a gradient field means for selectively causing gradient magnetic fields across the examination region;
a resonance excitation means for transmitting radio frequency signals into the examination region to excite selected dipoles within the examination region to resonate;
a quadrature phased array coil assembly for simultaneously receiving resonance signals in quadrature from connected subregions of the examination region;
at least two receiver means connected with the quadrature phased array coil assembly for demodulating magnetic resonance signals therefrom;
an image reconstruction means for constructing signals from the receiver means into an image representation;
a display means for converting the image representations into human readable displays.

13. The system as set forth in claim 12 wherein the resonance excitation means includes a radio frequency transmitter connected with the quadrature phased array coil assembly such that the quadrature phased array coil assembly functions in both transmit and receive modes.

14. A quadrature multiple coil array for placement within a bore of a magnetic resonance system for at least receiving radio frequency resonance signals from the resonating nuclei in an examination region, the quadrature multiple coil array comprising:
a first quadrature coil pair including a first perpendicular component sensitive coil sensitive to resonance signal components perpendicular to the first quadrature coil pair from a first subregion of the examination region and a first parallel component sensitive coil sensitive to resonance signal components parallel to the first quadrature coil pair form the first subregion of the examination region;
a second quadrature coil pair including a second perpendicular component sensitive coil sensitive to resonance signal components perpendicular to the second coil pair from a second subregion of the examination region and a second parallel component sensitive coil sensitive to resonance signal components from the second subregion which are parallel to the second coil pair, the first and second subregions being partially overlapping.

15. The quadrature multiple coil array as set forth in claim 14 wherein the first and second quadrature coil pairs are partially overlapping with an amount of overlap which minimizes mutual inductance and coupling between the coils.

16. The quadrature multiple coil array as set forth in claim 14 wherein the first perpendicular component sensitive coil includes one of a loop coil, a double loop coil, and a counter-rotating loop coil;
the second perpendicular component sensitive coil includes one of a loop coil, a double loop coil, and a counter-rotating loop coil;
the first parallel component sensitive coil includes one of a flat Helmholtz coil, a butterfly coil, and a planar pair;
the second parallel component sensitive coil includes one of a flat Helmholtz coil, a butterfly coil, and a planar pair.

17. The quadrature multiple coil array as set forth in claim 14 wherein at least one of the coils in each of the quadrature coil pairs includes an adjustable asymmetric portion for electronically adjusting the orthogonality of the quadrature coil pair.

18. The quadrature multiple coil array as set forth in claim 14 wherein the quadrature multiple coil array extends along a parallel plane.

19. The quadrature multiple coil array as set forth in claim 14 wherein the quadrature multiple coil array extends along a contoured surface.

20. The quadrature multiple coil array as set forth in claim 14 wherein a first portion of the quadrature multiple coil array extends along a plane and a second portion of the quadrature multiple coil array extends along a curved surface.

21. The quadrature multiple coil array as set forth in claim 14 wherein the first and second quadrature coil pairs include first and second loop coils disposed in a common plane and first and second Helmholtz coils.

22. The quadrature multiple coil array as set forth in claim 14 further including:
a third quadrature coil pair including a third perpendicular component sensitive coil sensitive to resonance signal components perpendicular to the third quadrature coil pair from a third subregion of the examination region and a third parallel component sensitive coil sensitive to resonance signal components parallel to the third quadrature coil pair from the third subregion of the examination region, the second and third subregions being partially overlapping;
a fourth quadrature coil pair including a fourth perpendicular component sensitive coil sensitive to resonance signal components perpendicular to the fourth coil pair from a fourth subregion of the examination region and a fourth parallel component sensitive coil sensitive to resonance signal components from the fourth subregion which are parallel to the fourth coil pair, the third and fourth subregions being partially overlapping.

23. A quadrature multiple coil array comprising:
a plurality of first linear coils which are sensitive to magnetic resonance signal components in a first direction, the plurality of first linear coils being disposed (1) to have minimum mutual inductance therebetween and (2) to view a continuum of subregions of a region of interest;
a plurality of second linear coils which are sensitive to magnetic resonance signal components that are in a second direction orthogonal to the first direction, the plurality of second linear coils being disposed (1) to have minimum mutual inductance, (2) to have minimum coupling to the first linear coils, and (3) to view the the continuum of subregions of the region of interest such that resonance signals emanating from the continuum of subregions are received in quadrature.

* * * * *